United States Patent
Kern et al.

(10) Patent No.: US 6,525,963 B2
(45) Date of Patent: Feb. 25, 2003

(54) PROGRAMMABLE READ-ONLY MEMORY AND METHOD FOR OPERATING THE READ-ONLY MEMORY

(75) Inventors: Thomas Kern, München (DE); Jürgen Peter, Taufkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/974,618

(22) Filed: Oct. 9, 2001

(65) Prior Publication Data

US 2002/0085414 A1 Jul. 4, 2002

Related U.S. Application Data

(63) Continuation of application No. PCT/DE00/01053, filed on Apr. 5, 2000.

(30) Foreign Application Priority Data

Apr. 9, 1999 (DE) .......................................... 199 16 065

(51) Int. Cl.[7] ................................................ G11C 16/06
(52) U.S. Cl. ............................. 365/185.09; 365/185.2; 365/185.28; 365/185.29; 365/185.33
(58) Field of Search ......................... 365/185.09, 185.2, 365/185.28, 185.29, 185.33, 185.01

(56) References Cited

U.S. PATENT DOCUMENTS

| | | | |
|---|---|---|---|
| 4,802,117 A | | 1/1989 | Chrosny et al. |
| 4,901,320 A | | 2/1990 | Sawada et al. |
| 5,127,097 A | | 6/1992 | Mizuta |
| 5,345,413 A | * | 9/1994 | Fisher et al. ................. 365/201 |
| 5,450,360 A | * | 9/1995 | Sato ....................... 365/185.11 |
| 6,038,175 A | * | 3/2000 | Ra .......................... 365/185.22 |
| 6,147,904 A | * | 11/2000 | Liron ....................... 365/185.03 |

FOREIGN PATENT DOCUMENTS

EP          0 756 287 A2         1/1997

OTHER PUBLICATIONS

John F. Wakerly: "Microcomputer Reliability Improvement Using Triple–Modular Redundancy", Proceedings of the IEEE, vol. 64, No. 6, Jun. 1976, pp. 889–895.

* cited by examiner

Primary Examiner—Hoai Ho
(74) Attorney, Agent, or Firm—Laurence A. Greenberg; Werner H. Stemer; Ralph E. Locher

(57) ABSTRACT

A programmable read-only memory and a method for operating the read-only memory are described. The memory contains at least one memory cell field with a plurality of memory cells, in addition to a plurality of memory segments formed of memory cells in which data and/or program parts can be stored. The memory further contains at least one redundant memory segment formed of memory cells and is assigned to one of the memory segments. The memory segment and the redundant memory segments assigned to the memory segment together form a memory block, in which all the memory segments have the same data content. At least one selection circuit for controlling the transfer of data and/or program parts to or from the memory segments of a memory block is assigned to each memory block.

19 Claims, 3 Drawing Sheets

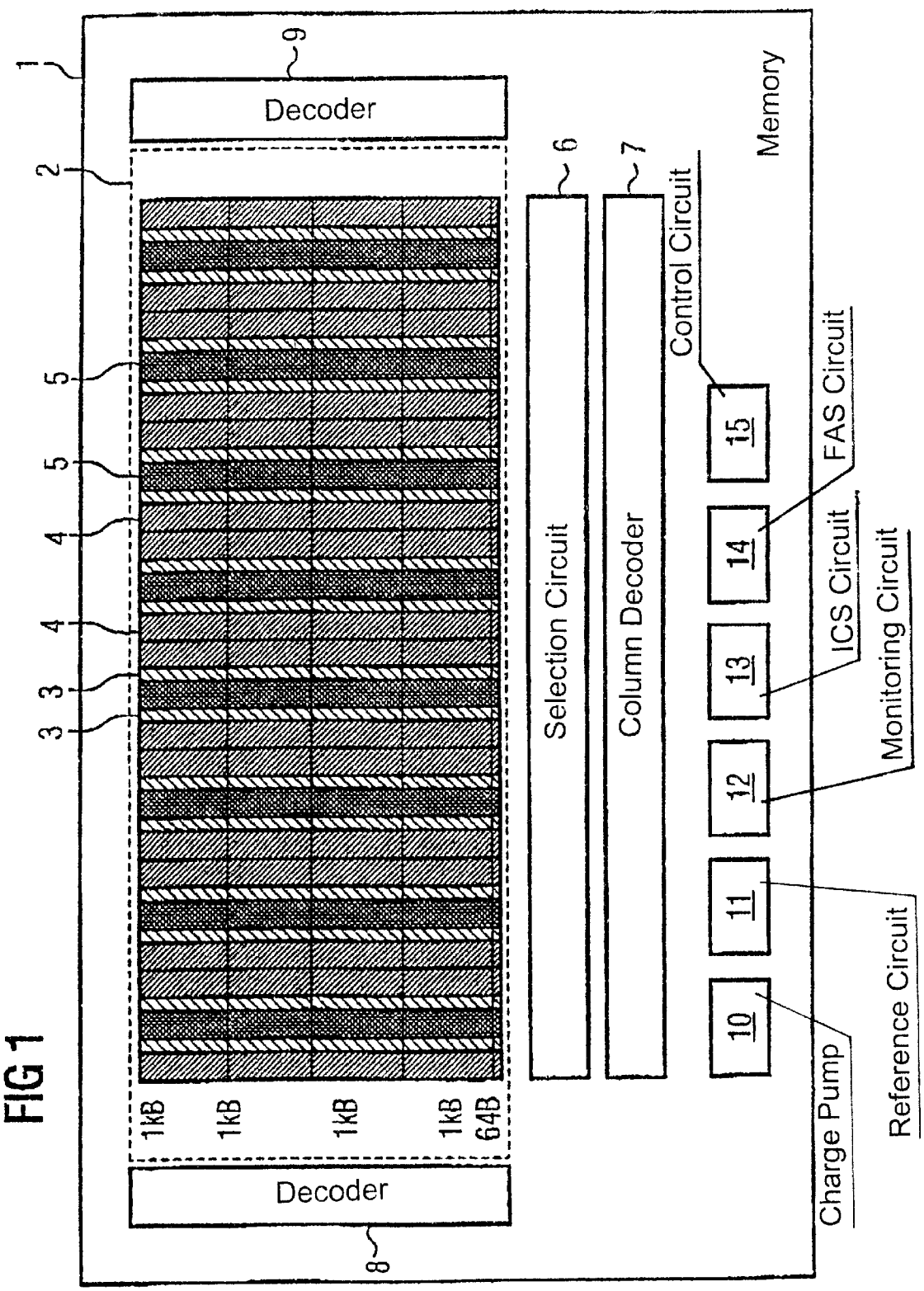

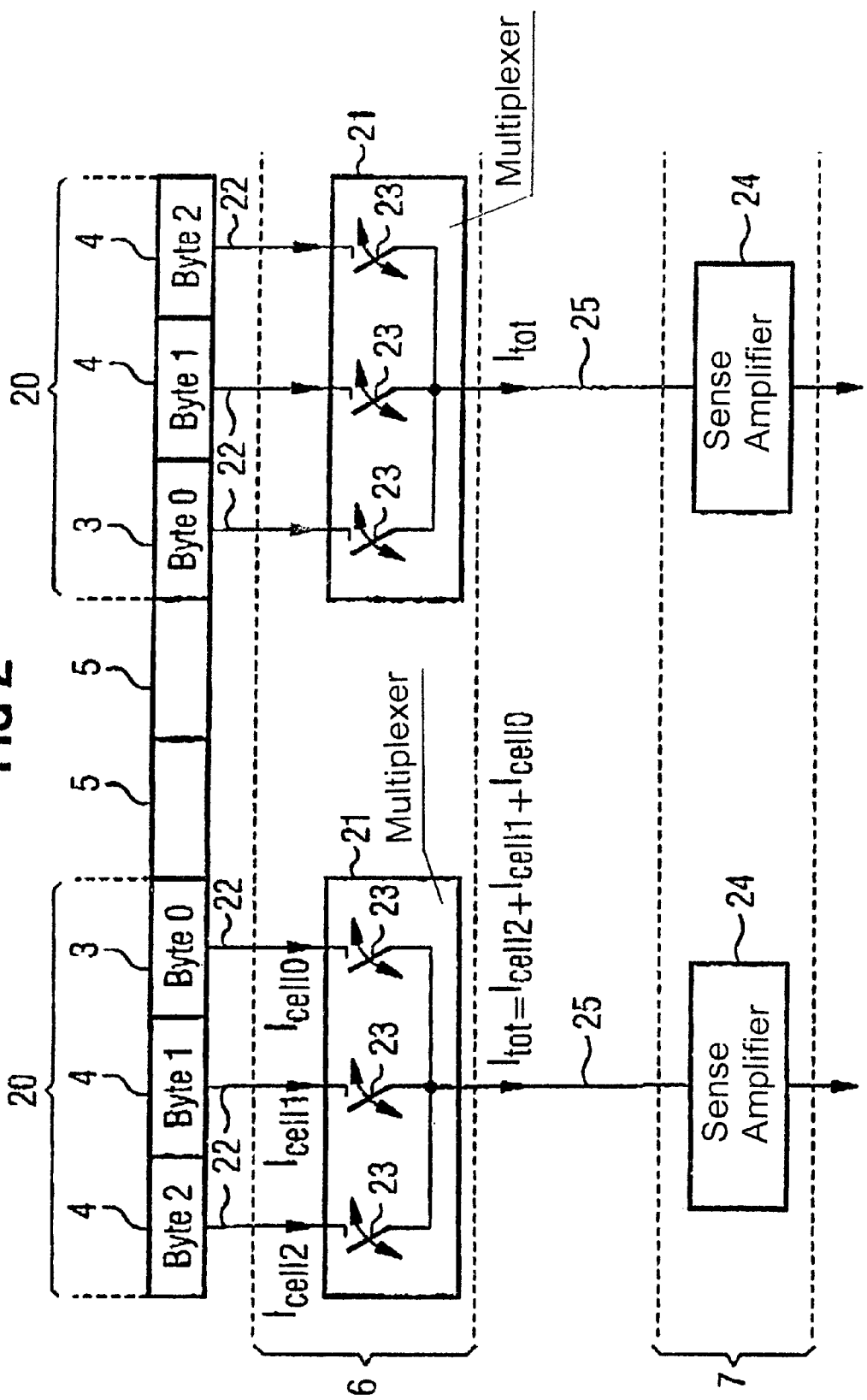

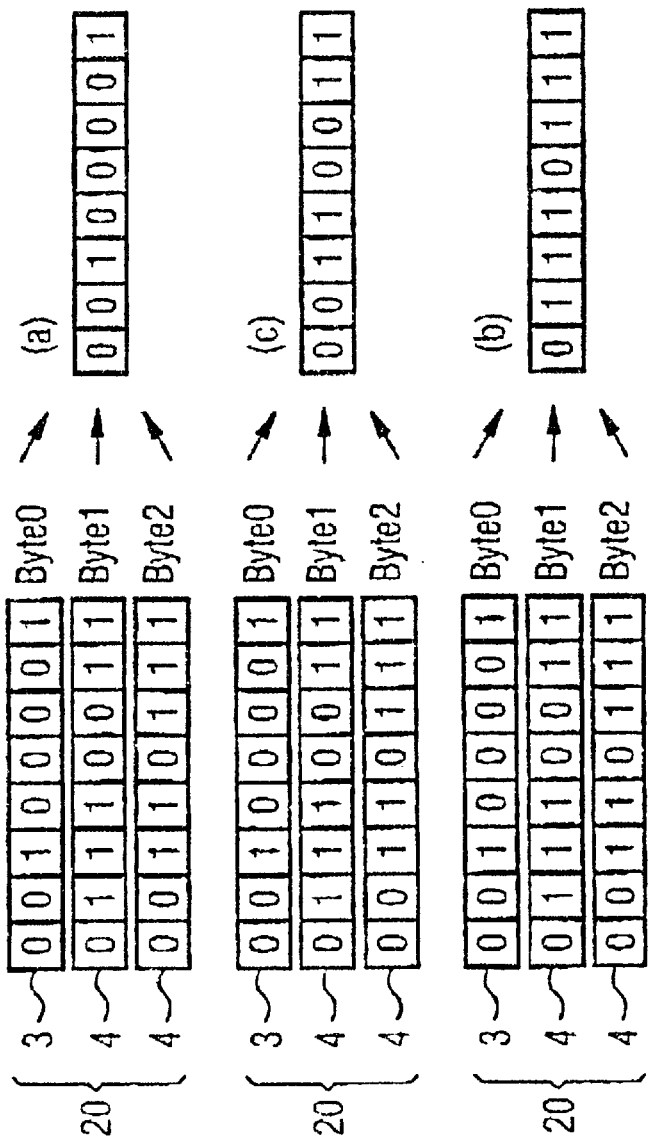

PROGRAMMABLE READ-ONLY MEMORY AND METHOD FOR OPERATING THE READ-ONLY MEMORY

CROSS-REFERENCE TO RELATED APPLICATION

This application is a continuation of copending International Application No. PCT/DE00/01053, filed Apr. 5, 2000, which designated the United States.

BACKGROUND OF THE INVENTION

Field of the Invention

The present invention relates to a programmable read-only memory, and to a method for operating the programmable read-only memory.

Programmable read-only memories or non-volatile memories are known in a multiplicity of embodiments, such as, for example PROMs, EPROMs, EEPROMs and do not require any further explanation. Such memories may be embodied as data memories or as program memories. In particular, the read-only memories which are embodied as EEPROMs can be programmed and erased, but the maximum number of possible write/erase cycles—referred to as endurance—is upwardly limited and depends in particular on the type of read-only memory.

Flash memories are read-only memories, which are distinguished by particularly simple and high-speed write/erase operations. In flash memories, the memory cells can be programmed electrically either individually or on a segment basis, but a flash memory can only be erased on a segment basis or only in its entirety. The erase operation is carried out by a short electrical erase pulse.

Flash memories are distinguished by a very low supply voltage and low power loss and are thus suitable in particular in systems with a local voltage supply, such as, for example, in a mobile telephone or portable audio appliance.

The demands placed on flash data memories are, in contrast to flash program memories, characterized by a significantly higher endurance and higher selectivity during programming and erasure. In addition, data memories are generally smaller than program memories.

In order to be able to meet the high demands in terms of the highest possible endurance, flash data memories are typically programmed and erased by what is referred to as Fowler-Nordheim tunneling because this method ensures lower and more homogeneous loading of the individual memory cells and their tunnel oxide, as is the case, for example, by programming with hot electrons (channel hot electrons). The thickness of the tunnel oxide in such memory cells is comparatively small, as a result of which it is possible to keep the necessary voltages comparatively low and the necessary times comparatively short during programming and erasure.

However, in particular flash memories, which are programmed and erased by Fowler-Nordheim tunneling are characterized by a comparatively high number of random memory defects such as what are referred to as erratic bits and moving bits, for example. Erratic bits are memory cells, which react differently to the same electrical stress, as a result of which memory faults can arise directly after programming. Moving bits are memory cells which lose their stored charge in a relatively short time, as a result of which the memory cells change their logic state over time. Both memory defects are however not reproducible and occur randomly.

Typical test programs on the wafer and module level for ensuring the quality and reliability of the memory are, however, are suitable only for reproducible memory defects. Memory cells, which are temporarily defective, such as erratic bits and moving bits, cannot be detected, or can only be detected randomly by the filters installed in the test programs.

A possible way of countering this type of fault is to use intelligent methods for detecting and correcting such defects. These methods employ comprehensive coding algorithms, such as, for example the Hamming Code, in which the respective code is stored in additional memory cells. It is very costly to evaluate the coded information because it requires additional evaluation circuitry as well as an additive logic circuit for write/read access operations.

SUMMARY OF THE INVENTION

It is accordingly an object of the invention to provide a programmable read-only memory and a method for operating the read-only memory which overcome the above-mentioned disadvantages of the prior art devices and methods of this general type, in which random memory defects can be reliably detected with minimum expenditure and can, if appropriate, be corrected.

With the foregoing and other objects in view there is provided, in accordance with the invention, a programmable read-only memory. The memory contains at least one memory cell array having a multiplicity of memory cells, a multiplicity of memory segments composed of the memory cells and in which data and program parts can be stored, and a multiplicity of redundant memory segments composed of the memory cells and each associated with at least one of the memory segments. In each case one of the memory segments and associated redundant memory segments together form a memory block in which the memory segment and the associated redundant memory segments have the same data content. The memory segment and the associated redundant memory segments of the memory block can be read, erased and/or written to simultaneously.

The read-only memory according to the invention with redundancy is distinguished in that the data and program parts to be stored are stored at least in duplicate. As a result, random defects can easily be detected and corrected. A minimum additional degree of outlay on circuitry is advantageously necessary for the redundancy concept because essentially an analog multiplexer and the corresponding redundant memory segments are necessary. Owing to the fact that just one single sense amplifier is necessary for all memory segments of a memory block, no additional current consumption occurs during the reading and writing. Furthermore, the fact that the memory segments of a memory block are read and written to in parallel results in that there are virtually no negative effects on the speed during write/read access operations.

In one preferred embodiment of the read-only memory, it has double redundancy, i.e. one memory segment and two redundant memory segments are provided per memory block. A read-only memory with double redundancy makes it possible to detect a maximum of two memory defects per memory segment. The double redundancy thus generally constitutes a good compromise in terms of the demands that random memory defects should be detected and corrected in a defined way and yet the additional area required for the redundant memory segments should not become too large. Of course, a lower degree of redundancy or a redundancy greater than two would also be conceivable. In particular, the latter case is advantageous if the data content of a memory segment is very large.

The read-only memory according to the invention is organized in segments, i.e. in each case one memory segment has a relatively large number of memory cells. All the memory segments of the read-only memory typically each have the same data length, for example one byte, one word or one double word.

In a further advantageous refinement, the read-only memory according to the invention has two operating modes. The normal read/write operating mode in which all the memory segments of a memory block are read, written to or erased simultaneously, and the test operating mode in which in each case a single memory segment of a memory block is read, written to or erased. For this purpose, a multiplexer circuit is provided which respectively selects one of the two operating modes. A sense amplifier circuit which is connected downstream of the multiplexer circuit is also adapted to the two operating modes, i.e. it has a corresponding reference level for each of the operating modes.

It is particularly advantageous if the aforesaid sense amplifier circuit has reference levels which can be adjusted in such a way that it is possible to distinguish whether the random defects to be expected occur predominantly as logic "0", as logic "1" or as both logic "0" and logic "1".

The invention is suitable, in particular in programmable read-only memories, which are embodied as flash memories. Moreover, the invention is particularly advantageous in such flash memories, which are programmed and/or erased by Fowler-Nordheim tunneling because, owing to the lower programming voltage, they typically have a higher random defect density than flash memories, which are programmed by "hot electrons". The present invention is however not exclusively restricted to flash memories but can also be used very advantageously in other programmable read-only memories, such as EPROMs or PROMs, for example.

Moreover, the present invention is particularly advantageous in data memories because they are characterized, in comparison with customary program memories, by a relatively high endurance and are thus particularly susceptible to the abovementioned random memory defects.

In accordance with an added feature of the invention, a selection circuit and write/read paths are provided. Each of the write/read paths is connected between one of the memory segment and the associated redundant memory segments of the memory block to the selection circuit. The write/read paths are disposed in parallel with one another.

In accordance with an additional feature of the invention, the selection circuit is a multiplexer through which, in a first operating mode, a single one of the memory segment and the associated redundant memory segments of the memory block can be read, written to or erased. And through the multiplexer, in a second operating mode, all of the memory segment and the associated redundant memory segments of the memory block can be simultaneously read, written to or erased.

In accordance with a further feature of the invention, a sense amplifier circuit is provided and during a read operating mode, the sense amplifier circuit is connected to the selection circuit. The sense amplifier circuit is suitable for reading a single one or all of the memory segment and the associated redundant memory segments of the memory block and the sense amplifier circuit has, for this purpose, at least two different reference levels.

In accordance with another feature of the invention, the at least two different reference levels of the sense amplifier circuit are adjustable depending on whether defects occurring during a writing to, erasure or reading of the memory cells occur predominantly as logic "1", as logic "0" or as both logic "1" and logic "0".

In accordance with a further added feature of the invention, the memory segment and the associated redundant memory segments have equivalent bit lengths, and the memory segment of the memory block is assigned precisely two of the redundant memory segments.

In accordance with a further additional feature of the invention, the memory cell array is an integrated data memory.

In accordance with another further feature of the invention, the read-only memory is a flash memory, which can be programmed and erased by use of Fowler-Nordheim tunneling.

With the foregoing and other objects in view there is further provided, in accordance with the invention, a method for operating a read-only memory containing at least one memory cell array having a multiplicity of memory cells, a multiplicity of memory segments composed of the memory cells and in which data and program parts can be stored, and a multiplicity of redundant memory segments composed of the memory cells and each associated with at least one of the memory segments. In each case one of the memory segments and associated redundant memory segments together form a memory block. The method includes the steps of providing the read-only memory with a first operating mode and a second operating for performing a read operation, a programming operation, and an erasing operation. In the first operating mode, a selection circuit simultaneously accesses both the memory segment and all of the associated redundant memory segments of the memory block through one write/read path in each case. The selection circuit accesses an individual one of the memory segment and the associated redundant memory segment of the memory block through the write/read path in the second operating mode.

In accordance with an added mode of the invention, there is the step of during a read operation, providing a sense amplifier circuit, which is supplied, in the first operating mode, with a sum of cell currents of both the memory segment and the associate redundant memory segments of the memory block through the selection circuit. The sense amplifier circuit generates a data output signal therefrom and in dependence on a first reference level. The sense amplifier is supplied, in the second operating mode, with a single cell current of an individual one of the memory segment and the associated redundant memory segments through the selection circuit. The sense amplifier circuit generates the data output signal therefrom and in dependence on a second reference level.

In accordance with a concomitant mode of the invention, there is the step of connecting or disconnecting reference elements to/from the sense amplifier circuit in dependence on whether defects generated during writing, erasure or reading occur predominantly as logic "1", as logic "0", or as both logic "1" and logic "0". As a result, the first reference level is adapted, by changing it, to the defects that occur.

Other features which are considered as characteristic for the invention are set forth in the appended claims.

Although the invention is illustrated and described herein as embodied in a programmable read-only memory and a method for operating the read-only memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram showing the architecture of a programmable read-only memory according to the invention with double redundancy;

FIG. 2 is a block diagram showing a detail of the read-only memory shown in FIG. 1, with reference to which the memory array according to the invention with redundancy is explained; and FIG. 3 is a block diagram of a few examples of a method for flexible bit error correction by adapting the reference level.

DESCRIPTION OF THE PREFERRED EMBODIMENTS

In all the figures in the drawing, identical or functionally identical elements are provided with identical reference symbols unless stated otherwise. Referring now to the figures of the drawing in detail and first, particularly, to FIG. 1 thereof, there is shown the architecture of a programmable read-only memory according to the invention with double redundancy.

In FIG. 1, the programmable read-only memory, which is embodied here as a flash data memory 1. In the present exemplary embodiment, the data memory 1 has an 8-bit granularity i.e. the input/output units (I/O ports) have a data length of 8 bits.

FIG. 1 shows a typical structure of the 8-bit data memory 1 which has a memory cell array 2 with a multiplicity of individual memory cells. The memory cell array 2 is divided into memory segments 3 and redundant memory segments 4. In each case what is referred to as a byte switch or selection segment 5 is assigned to each of the memory segments 3 and to the redundant memory segments 4 assigned to the memory segment 3. The individual memory segments 3, the redundant memory segments 4 and the selection segments 5 are not illustrated individually in FIG. 1 but rather merely the corresponding segments 3, 4, 5 which are combined in columns, the selection segments 5 having a dark background and the redundant memory segments 4 being shown by hatching. The precise structure of the segments 3, 4, 5 will be described in more detail below with reference to FIG. 2.

In addition, the data memory 1 in FIG. 1 has a selection circuit 6, which can be embodied, for example as a multiplexer, for selecting the individual memory segments 3 and the redundant memory segments 4. The selection circuit 6 is connected to a downstream column decoder 7 for selecting the different columns. For the reading mode, the column decoder 7, which is structured in a known fashion has a multiplicity of sense amplifier circuits. At the output end, the column decoder 7 is connected to a number of I/O ports, which are not illustrated in FIG. 1, corresponding to the granularity of the data memory 1.

In addition, the data memory 1 has a first line decoder 8, which drives the individual memory cells of a memory segment 3, 4 and a second line decoder 9, which drives the individual selection segments 5.

A typical data memory 1 has, as is illustrated in FIG. 1, the following elements: a charge pump 10, a reference circuit 11, which is provided for example as an oscillator for generating the clock for the charge pump 10 and/or the reference voltage, circuitry 12 for monitoring the operating voltage/current (power management), which contain, for example, a power economy mode. In addition, the data memory 1 can contain an interface control state (ICS) machine circuit 13, a flash area state (FAS) machine circuit 14 and a control circuit 15, which controls the internal and external transfer of data.

FIG. 2 is a schematic view of a detail of the read-only memory from FIG. 1, with reference to which the memory array according to the invention with redundancy is explained.

FIG. 2 shows two memory segments 3 to which in each case two redundant memory segments 4 are assigned. In each case a memory segment 3 and the redundant memory segments 4 assigned thereto form a memory block 20. Each memory block 20 is respectively assigned a selection segment 5 which controls the memory cells of the memory segments 3, 4.

However, the memory segments 3 and the redundant memory segments 4 are typically not necessarily of equal size, i.e. they have the same data length. Given a data length of one byte, each selection segment 5 therefore respectively controls 1 byte of the physical memory of the memory segments 3, 4 of the memory block 20 for the reading, programming and erasing operations.

The principle of the present read-only memory architecture is based on the fact that in each case identical data, program parts or other information is/are stored in all the memory segments 3, 4 of the memory block 20, i.e. in the present exemplary embodiment the content of the memory segment is respectively available in triplicate. However, this entails, as illustrated in FIGS. 1 and 2, merely tripling the physical memory. The region of the selection segments 5 for controlling the various memory segments 3, 4 is, by contrast, not enlarged.

FIGS. 1 and 2 therefore show a way of implementing the data memory 1 according to the invention with double redundancy, i.e. a maximum of two bit errors can be corrected per data content of the memory segment 3, 4.

In addition, FIG. 2 shows the selection circuit 6, which respectively contains a multiplexer circuit 21 for each of the memory blocks 20. The multiplexer circuits 21 are connected to each memory segment 3, 4 via, in each case, write/read paths 22 which are disposed in parallel with one another. The multiplexer circuits 21, which are connected into the respective write/read paths 22, can be connected into a circuit or disconnected from it by switches 23 in the multiplexer circuits 21 so that, for example, all the memory segments 3, 4 of the memory block 20 can be read, written to and erased individually or simultaneously and thus in parallel.

Each multiplexer circuit 21 is connected to a downstream sense amplifier circuit 24 via, in each case, one further 8-bit-long write/read path 25. The sense amplifier circuit 24 generates, in the reading mode, an 8-bit-long data signal, which is fed to the respective ports (I/O ports) of the data memory 1.

The various operating modes of reading, programming and erasure will be described in more detail below.

Reading

The data items in the three memory segments 3, 4 of the memory block 20 are not evaluated separately using the separate read paths 22 but instead the data items are combined on a single read path 25 by the single analog multiplexer 21 which is assigned to the memory block 20. The decision regarding the data item to be output is taken, in the read path 25, by the sense amplifier 24, which is adapted to the double redundancy of the data memory 1. The function of the sense amplifier 24 is generally to compare the overall cell current $I_{tot}$ which occurs during the reading operation with a reference current $I_{ref}$. If the overall cell current $I_{tot}$ is higher than the reference current $I_{ref}$, a logic "1", for example, is output. If it is lower, a logic "0" is output as the data item. An inverse logic to this would of course also be conceivable.

However, in the example in FIG. 2, the sense amplifier 24 is not supplied, during the reading of the three memory segments 3, 4 of the memory block 20, with the single cell current, which is produced during the reading of a single memory segment, but instead the sense amplifier 24 is supplied with the composite current ($I_{tot}=I_{cell0}+I_{cell1}+I_{cell2}$) which is produced by the combination or addition of the currents of the cells of the three memory segments 3, 4. The sense amplifier 24 can be adapted to this condition by simply standardizing and adapting the reference current $I_{ref}$.

Because the sense amplifier 24 constitutes the main current load in the reading mode, this implementation is not only advantageous with respect to minimum chip area but is also possible without additionally increasing the current consumption by using a single analog multiplexer 21 or a single sense amplifier 24.

In addition to the operating mode ("3 out of 3 mode") described above, in which all the memory segments 3, 4 of the memory block 20 are read simultaneously, a second operating mode ("1 out of 3 model") can also be provided for testing a single memory segment 3, 4, for example, for "hard faults". To do this, the multiplexer 21 is switched over from the "13 out of 3 mode" to the "1 out of 3 mode". For these purposes, it is also easily possible to switch over the sense amplifier 24 to the respective single cell current by displacing the corresponding reference level, in which case all that is necessary is a lower reference level in accordance with the redundancy.

Programming

Programming by the write/read paths 22, 25 is also controlled by the multiplexer 21 of the selection circuit 6. The memory segments 3, 4 of the memory block 20 are programmed here in an equivalent fashion to that in the read operation described above—by the multiplexer 21 but without intermediate connection of the sense amplifier 24. In the "3 out of 3 mode", all 3 memory segments 3, 4 are therefore written to in parallel, while in the test mode ("1 out of 3 mode") a single memory segment can be accessed on an individual basis.

Erasing

In the present exemplary embodiment, the contents of the memory segments 3, 4 of the memory block 20 are always erased in parallel, i.e. all the memory segments 3, 4 of the memory block 20 are erased simultaneously. However, it would also be conceivable for the memory segments 3, 4 also to be erased individually in a way equivalent to the reading and programming operations. This is however only appropriate in the test operating mode.

In the exemplary embodiment in FIG. 2, the corresponding reference level has been disposed precisely in the center between the respective current levels for a logic "0" and a logic "1". However, this presumes that random defects occur in an evenly distributed way during the storage of data, i.e. in each case an equal number of what are referred to as corrupt "Zeros" and corrupt "Ones" are generated. The terms corrupt "Zeros" and "Ones" refer to the respective memory defects here. However, it is not always possible to make this assumption. It is therefore desirable to be able to distinguish between corrupt "Zeros" and "Ones" when random defects occur.

The present invention provides here a reference level adapting method in which the reference levels of the sense amplifier 24 can be displaced, and thus adjusted. The reference level $I_{ref}$ is typically defined by an appropriate number of reference cells. By connecting the reference cells into the circuit and disconnecting them from the circuit, the reference level $I_{ref}$ can be displaced upward or downward. The advantage in this is that the type of fault, which can be corrected is freely selectable and the reference level setting circuit does not need to be hard wired. Moreover, this flexibility in the adaptation of the reference level results in that only a negligible additional amount of area is required.

Three examples of a flexible bit error correction by reference level adaptation are described below with reference to FIG. 3.

First, the random defects are preliminary corrupt Zeros given double redundancy of a memory segment, a maximum of two corrupt Zeros are corrected, but no corrupt One. The corresponding reference level $I_{ref}$ is below the single cell current $I_{cell}$ here.

Second, the random defects are predominantly corrupt Ones. The reference level $I_{ref}$ is higher than the double cell current ($2*I_{cell}$) and lower than three times the cell current ($3*I_{cell}$) As a result, up to two Ones are corrected, but no Zero.

Third, the random defects are approximately evenly distributed, that is to say approximately an identical number of corrupt Ones to the number of corrupt Zeros occurs. The reference level $I_{ref}$ corresponds here approximately to 1.5 times the cell current $I_{cell}$. During the reading out operation, a maximum of one corrupt One and a maximum of one corrupt Zero can be corrected here.

We claim:

1. A programmable read-only memory, comprising:
   at least one memory cell array having a multiplicity of memory cells, a multiplicity of memory segments composed of said memory cells and in which data and program parts can be stored, and a multiplicity of redundant memory segments composed of said memory cells and each associated with at least one of said memory segments, in each case one of said memory segments and associated redundant memory segments together form a memory block in which said memory segment and said associated redundant memory segment have the same data content, and said memory segment and said associated redundant memory segment of said memory block are read, erased and written to simultaneously.

2. The read-only memory according to claim 1, including:
   a selection circuit; and
   write/read paths, each of said write/read paths connected between one of said memory segment and said associated redundant memory segments of said memory block to said selection circuit, said write/read paths disposed in parallel with one another.

3. The read-only memory according to claim 2, wherein said selection circuit is a multiplexer through which, in a first operating mode, a single one of said memory segment and said associated redundant memory segments of said memory block can be read, written to or erased, and through said multiplexer, in a second operating mode, all of said memory segment and said associated redundant memory segments of said memory block can be simultaneously read, written to or erased.

4. The read-only memory according to claim 3, including a sense amplifier circuit and during a read operating mode, said sense amplifier circuit is connected to said selection circuit, said sense amplifier circuit suitable for reading a single one or all of said memory segment and said associated redundant memory segments of said memory block and said sense amplifier circuit having, for this purpose, at least two different reference levels.

5. The read-only memory according to claim 4, wherein the at least two different reference levels of said sense amplifier circuit are adjustable depending on whether defects occurring during a writing to, erasure or reading of said memory cells occur predominantly as logic "1", as logic "0", or as both logic "1" and logic "0".

6. The read-only memory according to claim 1, wherein said memory segment and said associated redundant memory segments have equivalent bit lengths, and said memory segment of said memory block is assigned precisely two of said redundant memory segments.

7. The read-only memory according to claim 1, wherein said memory cell array is an integrated data memory.

8. The read-only memory according to claim 1, wherein the read-only memory is a flash memory, which can be programmed and erased by use of Fowler-Nordheim tunneling.

9. A method for operating a read-only memory containing at least one memory cell array having a multiplicity of memory cells, a multiplicity of memory segments composed of the memory cells and in which data and program parts can be stored, and a multiplicity of redundant memory segments composed of the memory cells and each associated with at least one of the memory segments, in each case one of the memory segments and associated redundant memory segments together form a memory block, which comprises the steps of:

providing the read-only memory with a first operating mode and a second operating mode for performing a read operation, a programming operation, and an erasing operation, and in the first operating mode, a selection circuit simultaneously accesses both the memory segment and all of the associated redundant memory segments of the memory block through one write/read path in each case; and the selection circuit accessing an individual one of the memory segment and the associated redundant memory segment of the memory block through the write/read path in the second operating mode.

10. The method according to claim 9, which comprises:

during a read operation, providing a sense amplifier circuit, which is supplied, in the first operating mode, with a sum of cell currents of both the memory segment and the associate redundant memory segments of the memory block through the selection circuit, the sense amplifier circuit generating a data output signal therefrom and in dependence on a first reference level, and the sense amplifier is supplied, in the second operating mode, with a single cell current of an individual one of the memory segment and the associated redundant memory segments through the selection circuit, the sense amplifier circuit generating the data output signal therefrom and in dependence on a second reference level.

11. The method according to claim 10, which comprises connecting or disconnecting reference elements to/from the sense amplifier circuit in dependence on whether defects generated during writing, erasure or reading occur predominantly as logic "1", as logic "0", or as both logic "1" and logic "0", and as a result the first reference level is adapted, by changing it, to the defects which occur.

12. A programmable read-only memory, comprising:

at least one memory cell array having a multiplicity of memory segments formed of memory cells for storing data and program parts, and a multiplicity of redundant memory segments formed of further ones of said memory cells and each of said redundant memory segments associated with at least one of said memory segments, in each case one of said memory segments and an associated one of said redundant memory segments together forming a memory block in which said memory segment and said associated redundant memory segment of said memory block have the same data content, said memory segment and said associated redundant memory segment of said memory block are read, erased and written to simultaneously.

13. The read-only memory according to claim 12, including:

a selection circuit; and write/read paths, each of said write/read paths connected between one of said memory segment and said associated redundant memory segment of said memory block to said selection circuit, said write/read paths disposed in parallel with one another.

14. The read-only memory according to claim 13, wherein said selection circuit is a multiplexer through which, in a first operating mode, said memory segment or said associated redundant memory segment of said memory block can be read, written to or erased, and through said multiplexer, in a second operating mode, both said memory segment and said associated redundant memory segment of said memory block can be simultaneously read, written to or erased.

15. The read-only memory according to claim 14, including a sense amplifier circuit and during a read operating mode, said sense amplifier circuit is connected to said selection circuit, said sense amplifier circuit suitable for reading a single one of or both of said memory segment and said associated redundant memory segment of said memory block and said sense amplifier circuit having, for this purpose, at least two different reference levels.

16. The read-only memory according to claim 15, wherein the at least two different reference levels of said sense amplifier circuit are adjustable depending on whether defects occurring during a writing to, erasure or reading of said memory cells occur predominantly as logic "1", as logic "0", or as both logic "1" and logic "0".

17. The read-only memory according to claim 12, wherein said memory segment and said associated redundant memory segment have equivalent bit lengths, and said memory segment of said memory block is assigned precisely one of said redundant memory segments.

18. The read-only memory according to claim 12, wherein said memory cell array is an integrated data memory.

19. The read-only memory according to claim 12, wherein the read-only memory is a flash memory, which can be programmed and erased by use of Fowler-Nordheim tunneling.

* * * * *